United States Patent
Manness

(10) Patent No.: US 7,300,728 B2
(45) Date of Patent: Nov. 27, 2007

(54) PROCESSOR UNIT WITH PROVISION FOR AUTOMATED CONTROL OF PROCESSING PARAMETERS

(75) Inventor: Douglas Manness, North Vancouver (CA)

(73) Assignee: Kodak Graphic Communications Canada Company, Burnaby, British Columbia (CA)

( * ) Notice: Subject to any disclaimer, the term of this patent is extended or adjusted under 35 U.S.C. 154(b) by 124 days.

(21) Appl. No.: 10/376,500

(22) Filed: Mar. 3, 2003

(65) Prior Publication Data

US 2003/0219659 A1 Nov. 27, 2003

Related U.S. Application Data

(60) Provisional application No. 60/361,087, filed on Mar. 1, 2002.

(51) Int. Cl.
  *G03C 5/00* (2006.01)
  *G03F 9/00* (2006.01)
(52) U.S. Cl. .................. 430/30; 430/327; 430/330; 430/331
(58) Field of Classification Search ............ 430/30, 430/327, 330, 331
See application file for complete search history.

(56) References Cited

U.S. PATENT DOCUMENTS 5,716,743 A  2/1998  Stein et al.

FOREIGN PATENT DOCUMENTS

| | | |
|---|---|---|
| EP | 0082628 | 6/1983 |
| EP | 1091253 | 4/2001 |
| JP | 60252351 | 12/1985 |
| JP | 60257449 | 12/1985 |
| JP | 61233746 | 10/1986 |
| JP | 63015251 | 1/1988 |
| JP | 63132242 | 6/1988 |
| JP | 2001075269 | 3/2001 |
| JP | 2001-100398 | 4/2001 |
| JP | 2001-109166 | 4/2001 |
| JP | 2001092151 | 4/2001 |
| JP | 2001131928 | 5/2001 |
| JP | 2001142230 | 5/2001 |
| JP | 2001-183847 | 6/2001 |
| JP | 2001159811 | 6/2001 |
| JP | 2001166488 | 6/2001 |
| JP | 2001-201869 | 7/2001 |
| JP | 2003307824 | 10/2003 |
| JP | 2003316022 | 11/2003 |
| JP | 2003330203 | 11/2003 |
| WO | WO 01/029620 | 4/2001 |

*Primary Examiner*—Christopher G. Young
(74) *Attorney, Agent, or Firm*—Donna P Suchy

(57) ABSTRACT

An imaging device for preparing a printing surface for a printing operation transfers information related to how the printing precursor should be processed to a processor. The processor is automated to make local adjustments according to the information provided. The information can be transferred for each printing precursor or only when changes occur. The transfer is automated.

36 Claims, 2 Drawing Sheets

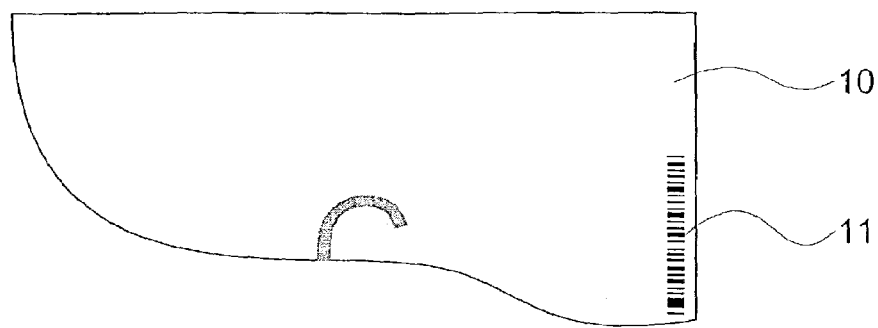
FIG. 2-A
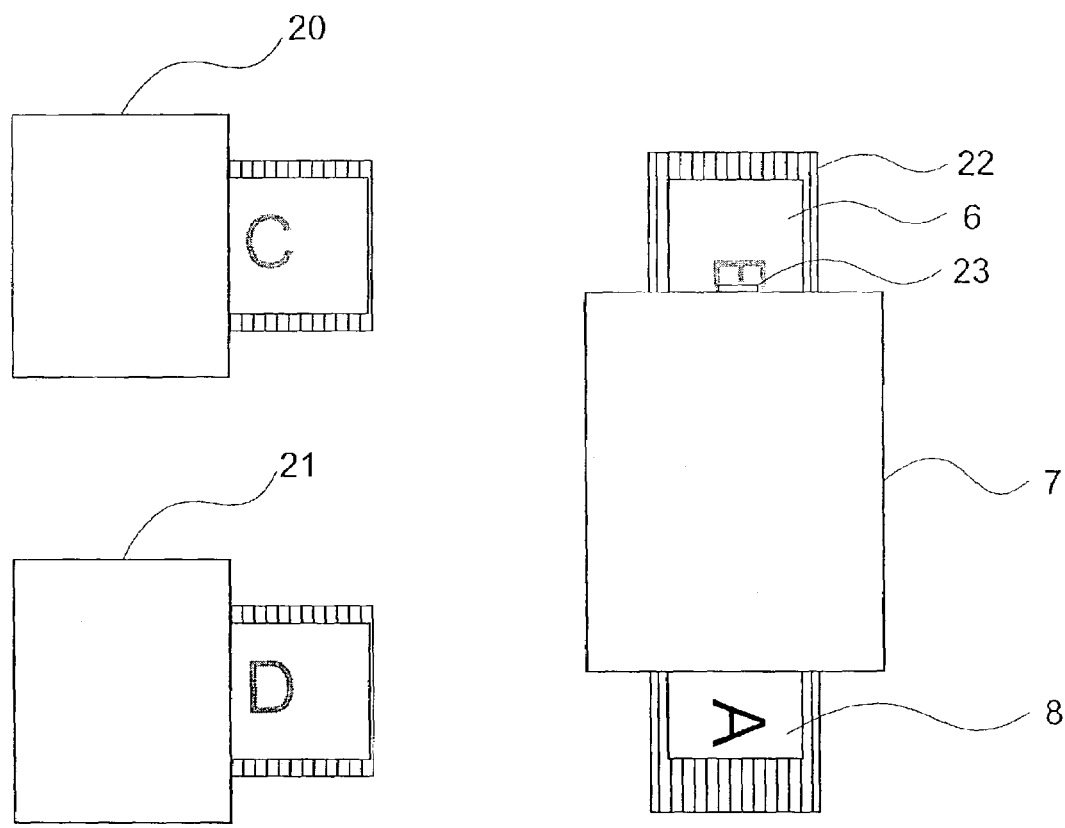
FIG. 2-B

PROCESSOR UNIT WITH PROVISION FOR AUTOMATED CONTROL OF PROCESSING PARAMETERS

TECHNICAL FIELD

The invention relates to processing imaged precursors such as lithographic printing plates. The invention relates specifically to adjusting a processing device for optimal processing performance.

BACKGROUND

In the printing industry a wide variety of printing methods are employed. Printing methods such as lithographic, flexographic, screen and gravure printing commonly involve preparing an image-bearing printing surface before commencing printing. Such printing surfaces are often prepared in an imaging device which uses an imagewise addressable radiation source to selectively convert or transform areas of a printing precursor.

In some cases the printing surface is directly ready for use following imagewise conversion. In most cases further processing is required. Processing may include further exposure to radiation, heating, chemical development, chemical etching, a variety of other processes or combinations thereof. In other imaging industries such as the direct imaging of printed circuit boards, imaging devices are commonly coupled with a processor of some description for further processing or development of the imaged article.

In the graphic arts industry, imaging and processing steps are usually performed by separate equipment, often provided by different manufacturers. For example, lithographic plates, and more particularly thermal lithographic plates are typically imaged in platesetter devices which use high power radiation sources such as lasers for imaging. After imaging, plates are removed from the platesetter and either manually or automatically conveyed to a processor. For negative working thermal plates, processing typically includes a preheat step, in which the plate is uniformly heated to crosslink imaged areas, followed by development in a chemical solution that removes non-imaged areas. The plates may be post-baked to improve their run length on press.

It is important to heat plates evenly during processing. The required preheat consistency over the plate surface for a negative working thermal plate is preferably in the range of 5° C.-10° C. and most preferably less than 2° C. It is also important to maintain any chemical solutions used in developing plates in good condition. In most instances, the chemical action which occurs during development of a plate weakens or contaminates the chemical solutions used.

Plate processors which provide automatic replenishment of developer chemistry and active control of preheat have been described and/or marketed by vendors. The inventor has observed that prior art processors equipped with such automatic function do not integrate well with imaging and processing systems.

WO 01/29620 to Haley et al., describes an integrated processor which has a pre-heat oven, a developer section, and an optional post-bake section. Preheat is controlled in one embodiment by varying the speed with which plates pass through the preheat section or the disposition of heating elements in response to a trigger such as the plate entering the preheat section. Further measurements of the plate such as width provide additional control inputs for maintaining even heating.

Stein et al., U.S. Pat. No. 5,716,743 to describes a system for monitoring the condition of a developer solution by measuring a number of parameters. Measurements such as conductivity and temperature of the developer solution are used along with knowledge of how the chemistry is degraded by processing particular formats and types of printing form. The system determines whether to dilute the developer solution with water or to add more developer.

There remains a need for a better apparatus and methods for processing imaged articles. There is a particular need for such apparatus and methods which can automatically accommodate articles of different dimensions and/or types. The printing industry has special need for such apparatus and methods.

SUMMARY OF INVENTION

One aspect of the invention provides a method for preparing a precursor. A precursor is imaged in an imaging device and then processed in a processor. The processor has a controller which adjusts the processor operation in accordance with information transferred from the imaging device to the processor. In another aspect of the invention the processor transfers information to the imaging device to enable adjustment to the imaging process and/or scheduling of imaging jobs according to conditions pertaining to the processor.

Another aspect of the invention provides apparatus for imaging and processing precursors. The apparatus includes an imaging device, a processor and means for transferring information about imaged precursors imaged by the imaging device to the processor.

Further aspects of the invention and features and advantages of specific embodiments of the invention are set out below.

BRIEF DESCRIPTION OF DRAWINGS

In drawings which illustrate non-limiting embodiments of the invention:

FIG. 2-A shows a marking scheme for a precursor according to one embodiment of the present invention; and, FIG. 2-B is a schematic depiction of a imaging and processing system utilizing the marked precursor of FIG. 2-A.

DESCRIPTION

Figure 1:
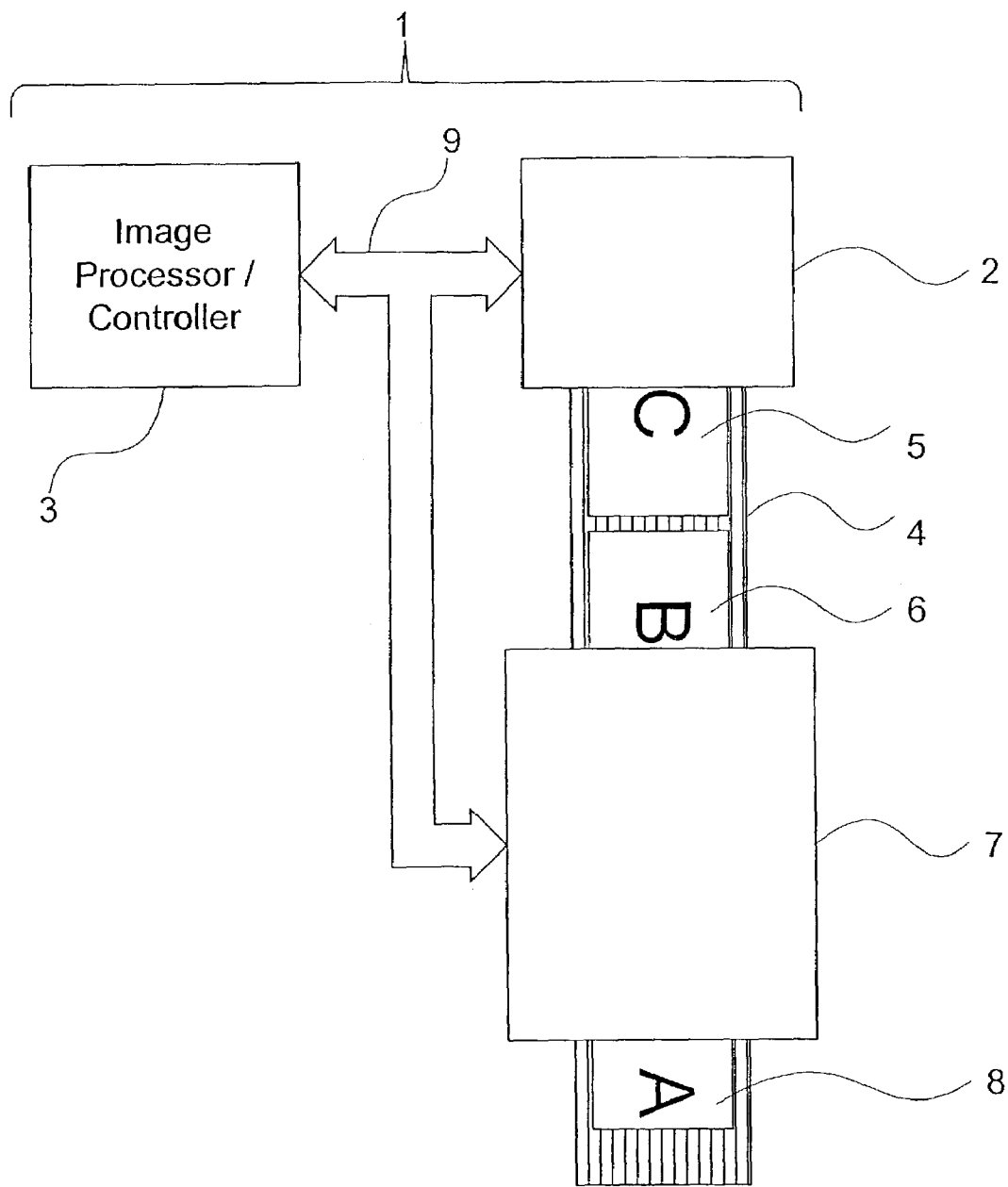
FIG. 1 is a schematic depiction of an imaging device and processor according to the present invention.

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive, sense.

This invention is described in relation to a system comprising an imaging device that is able to image a precursor (such as a media to be imaged) and a processor for processing the precursor. Processing parameters are adjusted according to information supplied to the processor by the imaging device. The imaging device may comprise an imagewise addressable radiation source, an imaging bed of any suitable configuration for holding the precursor, a suitable mechanism for scanning the radiation source across the precursor, and mechanisms for handling, loading and unloading the precursor.

An internal or external controller or combination thereof, receives image data and controls the functions of the imaging device. Such systems for imaging lithographic, flexographic, screen and gravure printing forms are well known in the art and range from devices that require manual precursor handling to fully automated machines capable of handling multiple precursor sizes and types in cassettes or other storage that are automatically selected and loaded. Furthermore, imaging systems are also used in analogous processes to produce other imaged articles such as printed circuit boards. Such systems are well known in the art.

The term "precursor" is used herein to refer to an object having a surface that can be imagewise exposed to form a pattern thereon. The surface may be coated with an imageable coating. The coating may be on a metal or synthetic substrate. The substrate may, for example, comprise a flat plate or a cylindrical sleeve substrate. The term "printing surface" is used herein to refer to the specific instance where the precursor is to be used in a printing operation.

FIG. 1 illustrates an embodiment of the invention. An imaging device 1, comprises an imaging engine 2 and a controller 3. For satisfactory imaging performance, it is common for controller 3 to have access to information identifying types of precursor with which imaging device 1 will be used. This information may, for example, be stored in a data store of any kind accessible to controller 3. The information may comprise a table or list of precursor parameters. The information may include precursor type, length, width, thickness, exposure sensitivity, exposure delivered, and data about an image to be imparted to the precursor by the imaging device.

A conveyor 4 receives precursors 5 and 6 imaged by imaging engine 2 and transports them to a processor 7.

Processor 7 comprises one or more sections (not shown) for processing the precursor. Processor 7 may comprise a processing line. In one specific embodiment of the invention for use with negative-working thermal lithographic printing plates, processor 7 comprises a preheat oven section and a chemical developer section. A processed printing surface 8, exits processor 7 and is either manually or automatically conveyed to a printing press.

Processor 7 includes a processor controller which monitors and/or adjusts a number of physical parameters related to the operation of processor 7. For example, the processor controller may control the application of preheat which is particularly important in processing negative thermal plates. Control of preheat may be provided by any suitable means such as adjusting an electrical current supplied to one or more heating elements, moving louvers disposed in front of a heater to deflect radiant heat, changing a feed rate of the plates, or moving one or more heating elements. In some embodiments of the invention, heat applied to the leading and trailing edges of a plate is evened out by moving heating elements with the plate as the plate enters a preheating section, and then moving the heating elements in the direction opposing plate movement as the plate leaves the preheat section.

Controller 3 communicates with imaging engine 2 via communication path 9. Communication path 9 may comprise any suitable data communication path such as, for example, one or more signal lines, a signal bus, an optical fiber, a wireless link, an optical link or any other path for transferring information. Communication path 9 is also used to permit communication between controller 3 and processor 7. Communications between controller 3 and processor 7 may be carried on the same pathway or on a separate pathway from communications between controller 3 and imaging engine 2. Those skilled in the art will understand that any of a wide variety of communications technologies may be used to provide suitable communication between controller 3, imaging engine 2 and processor 7. Controller functions may be moved from one device to another without changing the principles of operation of the system or departing from the invention.

The communication path 9 between imaging device 1 and processor 7 transfers information related to precursors 5 and 6 on a continuous or plate-by-plate basis. The information transferred is of use to processor 7 in controlling functions related to further exposure steps, heating steps, development steps and any other processor functions including replenishment of developer chemical solutions.

In an alternative embodiment the communication path between the imaging device and processor 7 is provided, at least in part, by marking machine-readable codes on imaged items to be processed by processor 7. In FIGS. 2-A and 2-B a precursor 10 is shown with a code 11 imprinted in a non-printing area of its surface. Code 11 carries information related to the processing of the plate encoded by some means into a readable form. Code 11 may comprise a bar code, a series of detents on an edge of precursor 10, a number or any other convenient code that can be marked on a precursor surface and subsequently read by a reader device 23 associated with processor 7.

Advantageously the imaging device radiation source is used to write marks which make up code 11 on precursor 10 as part of or additional to the image. Should the normal imaging intensity not be sufficient to make a mark with sufficient contrast to detect in reader 23 the mark could be overwritten several times or imaged at a slower scan speed.

For precursors that do not display a latent image of sufficient contrast to be read by a reader 23, the mark could be made by other means such as an inkjet printing head. Inkjet printers and particularly continuous inkjet printers are commonly used for marking variable data on manufactured goods. Modular industrial printer systems are commonly available for marking and batch coding. There are many suitable methods for imprinting a readable code 11 on an article. Any such method may be used in this invention.

The plate coding system shown in FIG. 2-A and FIG. 2-B does not require any physical connection between imaging devices 20 and 21 for transferring the necessary information to processor 7. This system can be used even in cases where precursors are manually transported and fed into a processing line or a single processor line serves several imaging devices.

The general concept of establishing a communication link between one or more imaging devices and a processor will now be discussed in relation to some specific examples of information that can advantageously be transferred.

EXAMPLE 1

Precursor Dimensions

Advantageously information specifying the dimensions of each precursor are transferred to the processor from the imaging device. While the processor may comprise a sensor which permits it to determine precursor length (e.g. from a sensor on the feed table and knowledge of the feed rate), width and thickness are more difficult to measure in a processor.

Most imaging devices require dimensional parameters to be retained for setting up the imaging process and/or handling the precursor. Specifically, an imaging device will need to know the length and width of a plate in order to load it correctly onto the imaging bed. Once it is loaded the imaging systems need to know where the media is placed on the imaging bed so that the image can be scanned onto the precursor in correct registration. These dimensions will either be supplied to the imaging device by the operator or determined by the device using a suitable measurement system. Thickness is also an important parameter for imaging systems that perform geometric correction or employ autofocus systems. The required dimensions are also typically listed on the packaging for the precursor and most imaging devices have facilities for inputting and saving these parameters in memory or other storage means. This information is typically unavailable to a processor being used to process precursors imaged by the imaging devices.

In this example, information obtained in the imaging of a precursor which specifies length, width, and thickness of the precursor is communicated to the processor. This information is then used by the processor to calculate optimal preheat application for the particular precursor. The preheat control may be in both the longitudinal and crosswise directions, allowing the preheat delivery to be carefully controlled over the entire area of the plate. This is particularly important for situations where many different widths of plate are used.

Information about the area of each precursor can additionally be used to maintain a record of the total area of precursor processed by the processor. This information may then be used for developer replenishment purposes.

EXAMPLE 2

Precursor Type

While a processor is generally equipped to process a specific precursor type, a situation may exist where a printing plant has several imaging devices outputting precursors of similar but possibly slightly different compositions. As imaging media such as negative working thermal plates become more commonplace, it is also possible that their compositions and processing requirements will become more generic, possibly allowing plates of different composition to be passed through a common processor. By transferring a type identifier to processor 7 for or with each plate to be processed by processor 7, processor 7 can determine to process a specific plate differently from other plates. The amount of preheat applied, the feed rate, and other processor functions can be changed, enabled, or disabled to suit a particular precursor.

Furthermore, since for many printing precursors the performance and run length on press is at least partially determined by the processing conditions, a precursor targeted for a long run length job can be specifically processed to promote a longer run length. Specifically if a post-bake oven section is included in the processing line, this section can be selectively enabled or disabled for long run length jobs. Similarly, other properties related to the processing conditions can be enhanced on a plate-by-plate basis if information concerning the job is transferred to processor 7. In the case of a printed circuit board manufacturing line, other parameters such as designations as inner or outer layers or line thickness may be provided to processor 7.

EXAMPLE 3

Image Area and Image Constitution

Precursor area is easily determined by a prior art processor from measurement of length and width of the plate, but image area is very difficult to detect at a processor 7. Advantageously the imaging device can be equipped to determine a number of parameters related to image area that can assist in adjusting a processor for optimal operation. Specifically the actual imaged area is a more relevant parameter for determining developer replenishment needs than the simple surface area of a precursor. "Actual imaged area" means the sum of the areas of all image pixels on a precursor. Obviously, a page of simple text has an image area significantly different from that of a picture on a dark background. Depending on the precursor and processing method, either the image area or the non-image area is removed in the processing line. In cases where the developer section can be considered as acting essentially only on the part of the image that must be removed to create the printing plate, accumulating the total actual imaged area over a plurality of processed precursors, is a much more accurate measurement of developer consumption than precursor surface area.

Transferring from the imaging device to the processor information about the image content can advantageously be used to control the processing conditions. Printers today use a variety of line screen frequencies and screening methods that vary the minimum dot size considerably. Particularly in the case of FM or stochastic printing, dot sizes can be as small as the single pixel. The processing conditions can be adjusted to best suit the actual image constitution on a particular precursor. Specifically, for fine FM screens, excess preheat may start to fill in between the dots while an overactive developer might result in significant erosion of small dots. In contrast the larger dots of a low AM screen frequency are much less susceptible to this problem and it may be beneficial to apply additional preheat to achieve greater run length on press. The information transferred may comprise a measure of smallest dot size, screen frequency or the like.

EXAMPLE 4

Exposure Level

For successful preparation of a printing surface the combination of imaging exposure and processing activity is often a critical balance. Specifically in the case of negative working thermal plates, it is the combination of imagewise exposure and preheat that ensures that the plate will be correctly exposed to provide a desired image quality and run length. A lower or higher exposure during imaging may have some advantages in printing a particular image but if not compensated by a preheat adjustment, the printing surface may end up being under or over-exposed. Again by providing a plate-by-plate transfer from the imaging device to the processor of information which indicates an exposure provided to each plate by the imaging device, the processor can automatically adjust processing conditions for each plate to match the imaging exposure.

EXAMPLE 5

Processor Maintenance

Information may also be transferred from the processor to the imaging device. This information may be used in various ways by the imaging device. If the processor requires a developer replenishment it could assert a busy flag, indicating to the imaging device or devices feeding it that it is not ready to receive a precursor. This is particularly advantageous for precursors where the latent images formed by imagewise conversion have limited persistence or cases where imaged precursors can be degraded by exposure to ambient light. The imaging device may be configured not to start imaging a precursor if the processor status information indicates that the processor is not ready to process the imaged precursor.

The processor could also communicate to the controller when chemistry changes or other maintenance is done, thus allowing the controller to modify the subsequent processing conditions. Furthermore, conditions of the chemistry, such as conductivity, are sometimes measured by the processor and could be used for further adjustment of the processing or imaging processes.

Thermal lithographic plates are used as examples in the foregoing description to illustrate the operation of the present invention. However, the invention is applicable to other modes of printing and imaging such as flexography, gravure, and screen-printing. The invention may be applied in any case where a processing step follows an imagewise exposure step, particularly when the steps are at least partially interdependent. The invention is also applicable to the processing of sleeve forms that are used in rotogravure, flexographic and screen-printing. These sleeve forms are usually processed "in-the-round" in specialized equipment.

Similarly, the invention may be applied in an apparatus for manufacturing circuit boards. In this case, a processor may be provided with information regarding parameters of circuit board precursors to be processed such as different line widths, thickness of substrates, and the like. The processor automatically adjusts processing conditions based upon such parameters.

While the invention has been described in terms of a plate-by-plate information transfer, the transfer of information from an imaging device to a processor could also be done on a batch basis, thus grouping a number of like precursors together and only communicating changes when necessary.

Where a component (e.g. a software module, processor, assembly, device, circuit, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

Those skilled in the art will appreciate that the conception on which this disclosure is based may readily be utilized as a basis for the design of other apparatus for carrying out the several purposes of the invention. It is most important, therefore, that this disclosure be regarded as including such equivalent apparatus as do not depart from the spirit and scope of the invention.

What is claimed is:

1. A method for preparing one or more precursor batches of identically coated precursors, the method comprising:
    thermally imaging the precursor in an digital thermal imaging device;
    automatically transferring digital information from the digital thermal imaging device to a processor controller associated with a processor for processing the precursor; and
    operating the processor controller to adjust operation of the processor based upon the transferred digital information.

2. A method according to claim 1 comprising transferring status information from the processor to the imaging device and controlling operation of the digital thermal imaging device based upon the status information.

3. A method according to claim 1 wherein the information comprises one or more dimensions of the precursor.

4. A method according to claim 3 wherein the one or more dimensions comprise a thickness of the precursor and a width of the precursor.

5. A method according to claim 3 wherein the one or more dimensions comprise a width of the precursor, the imaging device
    comprises a width measurement mechanism for determining a width of the precursor, and the method comprises measuring a width of the precursor using the width measurement mechanism and including the measured width in the information.

6. A method according to claim 1 wherein the information comprises one or more of a type of precursor, digital information on an image area of a digital image imaged on the precursor, and image constitution of an image imaged on the precursor.

7. A method according to claim 1 comprising determining actual image area digital information for a digital image imaged on the precursor by the imaging device; transmitting the actual digital image area the digital information;
    maintaining a total actual imaged digital information for the area of precursors processed by the processor; and adjusting a chemistry of a developer solution in the processor based upon the actual imaged area digital information.

8. A method according to claim 1 wherein adjusting the operation of the processor comprises controlling heat applied to the precursor in a preheat oven section of the processor based upon the digital information.

9. A method according to claim 8 comprising controlling the heat applied to the precursor based on one or more dimensions of the precursor.

10. A method according to claim 9 comprising controlling the heat applied to the precursor based on a width of the precursor.

11. A method according to claim 9 wherein controlling the heat comprises adjusting an electrical current provided to an electrical heater.

12. A method according to claim 9 wherein controlling the heat comprises adjusting a feed rate of the precursor through the preheat oven section.

13. A method according to claim 9 wherein controlling the heat comprises adjusting physical locations of one or more heating elements disposed to heat the precursor.

14. A method according to claim 9 wherein controlling the heat comprises moving one or more heat deflecting shields disposed between a heating element and the printing precursor.

15. A method according to claim 1 wherein the batch of identically coated precursors comprise a precursors for a printing surfaces.

16. A method according to claim 15 wherein the printing surface is one of a lithographic printing surface;
a screen;
a gravure printing surface;
a letterpress printing surface; and
or a flexographic printing surface.

17. A method according to claim 1 wherein automatically transferring digital information from the digital thermal imaging device to the processor comprises marking a code representing the information on the precursor and reading the code at a reading device associated with the processor.

18. A method according to claim 17 wherein the imaging device comprises an imagewise addressable radiation source and marking the code on the precursor comprising controlling the radiation source to mark the code on the precursor.

19. A method according to claim 1 wherein automatically transferring information from the imaging device to the processor comprises transmitting a data signal from the digital thermal imaging device to the processor.

20. A method according to claim 1 wherein the digital information comprises feature size information characterizing a smallest feature size in an image imparted to the precursor and the processor controller controls operation of a preheat stage based upon the feature size information.

21. A method according to claim 1 wherein the digital information comprises exposure information characterizing an exposure level of an image imparted to the precursor and the processor controller controls operation of a preheat stage based upon the exposure information.

22. A digital thermal method for preparing groups of identically coated imaged items, the method comprising:
imaging a plurality of items in a digital thermal imaging device; determining at least approximately an actual imaged area for each of the imaged items;
processing the items by a process involving a developer chemistry; and, maintaining an index representing a status of the developer chemistry based upon the actual imaged areas determined for the processed items and replenishing the developer chemistry when the index indicates that the developer chemistry requires replenishment.

23. A method according to claim 22 wherein the groups of identically coated items comprise printing plates.

24. A method according to claim 23 wherein the printing forms comprise gravure cylinders.

25. A method for imaging groups of identically coated items, the method comprising:
providing to an imaging device digital information comprising digital information characterizing an item; operating the imaging device to thermally image the item in a digital thermal imaging device based on the digital information;
marking a code bearing the digital information onto the item; passing the item to a processing device; reading the code; and operating the processing device to process the image on the item in a manner at based on digital information read from the code.

26. A method for preparing a precursor, the method comprising:
thermally imaging a precursor in an digital thermal imaging device;
automatically transferring information from the digital thermal imaging device to a processor controller associated with a processor for processing the precursor:
operating the processor controller to adjust operation of the processor based upon transferred information; and
wherein the information comprises one or more of type of precursor, exposure parameters and image constitution of a digital image imaged on the precursor.

27. A method according to claim 26 comprising transferring status information from the processor to the imaging device and controlling operation of the imaging device based upon the status information.

28. A method according to claim 26 wherein the method further comprises a precursor batch of like precursors that are handled on a batch basis so that the automatically transferring information and operating the processor controller steps are done on a group basis when necessary.

29. A method according to claim 28 wherein the printing surface is one of a lithographic printing surface; a screen; a gravure printing surface; a letterpress printing surface; or a flexographic printing surface.

30. A method according to claim 26 wherein automatically transferring information from the imaging device to the processor comprises marking a code representing the information on the precursor and reading the code at a reading device associated with the processor.

31. A method according to claim 30 wherein the imaging device comprises an imagewise addressable radiation source and marking the code on the precursor comprises controlling the radiation source to mark the code on the precursor.

32. A method according to claim 26 wherein automatically transferring information from the imaging device to the processor comprises transmitting a data signal from the imaging device to the processor.

33. A method according to claim 32 wherein the automatically transferring information step from the imaging device to the processor comprises transmitting a data signal from the imaging device to the processor further comprises a wireless device.

34. A method according to claim 26 wherein the information comprises feature size information characterizing a smallest feature size in an image imparted to the precursor and the processor controller controls operation of a preheat stage based upon the feature size information.

35. A method according to claim 26 wherein the information comprises exposure information characterizing an exposure level of an image imparted to the precursor and the processor controller controls operation of a preheat stage based upon the exposure information.

36. A method for imaging pixilated digital items, the method comprising:
providing to a digital thermal imaging device information characterizing an item;
operating the imaging device to image the item based on the information; marking a code bearing the information onto the item; passing the item to a processing device;
reading the code; and
operating the processing device to process the image on the item in a manner determined based on information read from the code.

* * * * *